United States Patent
Kirner

(10) Patent No.: US 7,016,197 B2
(45) Date of Patent: Mar. 21, 2006

(54) ELECTRONIC BUILT-IN DEVICE

(75) Inventor: Herbert Kirner, Villingen-Schwenningen (DE)

(73) Assignee: Siemens Aktiengesellschaft, Munich (DE)

(*) Notice: Subject to any disclaimer, the term of this patent is extended or adjusted under 35 U.S.C. 154(b) by 149 days.

(21) Appl. No.: 10/418,248

(22) Filed: Apr. 18, 2003

(65) Prior Publication Data

US 2004/0042193 A1  Mar. 4, 2004

(30) Foreign Application Priority Data

Apr. 26, 2002  (DE) ............................... 102 18 891

(51) Int. Cl.
 H05K 5/00 (2006.01)
 H05K 5/04 (2006.01)
 H05K 5/06 (2006.01)

(52) U.S. Cl. .................. 361/752; 361/797; 361/800

(58) Field of Classification Search .............. 361/752, 361/797, 800, 683, 686, 725, 741, 802, 727, 361/756, 742; 439/377
See application file for complete search history.

(56) References Cited

U.S. PATENT DOCUMENTS

| 4,461,593 A | | 7/1984 | Rodseth |
| 4,898,538 A | | 2/1990 | Tratar et al. |
| 5,414,597 A | * | 5/1995 | Lindland et al. ............ 361/816 |
| 5,544,006 A | * | 8/1996 | Radloff et al. ............. 361/683 |
| 5,764,487 A | * | 6/1998 | Natsume ..................... 361/775 |
| 6,147,862 A | * | 11/2000 | Ho ............................. 361/685 |

FOREIGN PATENT DOCUMENTS

| EP | 1 172 769 A2 | 1/2002 |
| EP | 1 184 667 A2 | 3/2002 |

OTHER PUBLICATIONS

Derwent Abstract EP1,172,769.
Derwent Abstract EP1,184,667.

* cited by examiner

*Primary Examiner*—Kamand Cuneo
*Assistant Examiner*—Hung S. Bui
(74) *Attorney, Agent, or Firm*—Siemens AG; J. Eisenberg

(57) ABSTRACT

In the case of an electronic built-in device with a front wall and a built-in housing part comprising a cover, a base, side walls and a rear wall, and also with a printed circuit board, arranged transversely in relation to the rear wall, connected to at least two housing elements of the built-in housing part and carrying the electronic subassemblies and components of the built-in device and also a plug socket, the access to the contacts of the plug socket aligned parallel to the printed circuit board taking place through a clearance provided on the rear wall of the built-in housing part, it is provided that guiding surfaces are formed on the plug socket at right angles to the direction of the plug-in contacts of the plug socket, that the guiding surfaces of the plug socket are assigned within the built-in housing part a guide parallel to the rear wall, without any play, and that the diameters of the through-holes provided in the printed circuit board and serving for fastening the printed circuit board in the built-in housing part by means of screws are larger than the shank diameters of the screws used, by an amount corresponding substantially to the sum of the production tolerances of the components to be joined together.

8 Claims, 3 Drawing Sheets

ELECTRONIC BUILT-IN DEVICE

CONTINUATION DATA

The present invention claims priority to German patent application 10218891.2, filed 26.04.2002, which is incorporated herein by reference.

STATEMENT REGARDING FEDERALLY SPONSORED RESEARCH OR DEVELOPMENT

Not applicable.

REFERENCE TO SEQUENCE LISTING, A TABLE, OR A COMPUTER PROGRAM LISTING COMPACT DISK APPENDIX

Not applicable.

BACKGROUND OF THE INVENTION

The present invention relates to an electronic built-in device with a front wall and a built-in housing part comprising a cover, a base, side walls and a rear wall, and also with a printed circuit board, arranged transversely in relation to the rear wall, connected to at least two housing elements of the built-in housing part and carrying the electronic subassemblies and components of the built-in device and also a plug socket, the access to the contacts of the plug socket aligned parallel to the printed circuit board taking place through a clearance provided on the rear wall of the built-in housing part.

Walls of built in devices are generally constructed of rather thin steel sheets so as to maximize available space within the device. Accordingly, the built-in housing part or housing forms an enclosure which serves to protect its interior from dust and unwanted contact. In addition, the housing serves as an electromagnetic shield for electronic components within the housing. Such components may include a printed circuit board, which may further cooperate with a structural part within the housing so as to serve as part of a reinforcing skeleton.

Components within the housing are typically subject to mechanical forces resulting from connection and disconnection with data and/or power sources. This normally occurs via acts of plugging and unplugging lines. Per this action, the components, such as the printed circuit board is susceptible to structural damage and/or bending. Accordingly, circuit board components and connections become vulnerable to damage, and, the wear and tear tends to shorten lifespans of such vulnerable components. Because of the relatively large production tolerances for injection-molded parts, this applies even if the plug socket which is produced in this way is fastened to the printed circuit board by aligning pins and locking hooks.

If, in the case of the present built-in device, such as may be the case for a tachograph wherein a plug socket provided with a plurality of plug chambers formed next to one another, torsional moments not only occur transversely, but also parallel to the plane of the printed circuit board during the inserting and pulling of the usual eight-pin plugs. Moreover, during the installation of a tachograph in a commercial vehicle, considerable forces can occur in all manner of different directions at the installation location, (i.e. in the region within reach of the driver), on account of the spatially unfavorable installation conditions which, under some circumstances, make it necessary for the plugs to be blind fitted. Furthermore, in the case of a tachograph, after its installation, the cluster of lines, of considerable rigidity, may exert a constant elastic reaction on the plug socket on account of the deflections required during installation and possibly also compression.

SUMMARY OF THE INVENTION

Accordingly, it is an intention and advantage of the present invention to address the problems and difficulties set out above. In particular, this includes addressing forces and their impact upon components within the housing and components and connections thereof. These forces generally arise during the insertion and removal of plugs into and from the housing. Further forces arise during installation as well as blind fitting.

The present invention achieves the above by providing for guiding surfaces formed on the plug socket at right angles to the direction of the plug-in contacts of the plug socket, such that the guiding surfaces of the plug socket are assigned, within the built-in housing part, a guide parallel to the rear wall, without any play, and that the diameters of the through-holes provided in the printed circuit board and serving for fastening the printed circuit board in the built-in housing part by means of screws, are larger than the shank diameters of the screws used, by an amount corresponding substantially to the sum of the production tolerances of the components to be joined together.

An additional embodiment provides that the guide is formed by means of the rear wall and guide strips attached to the built-in housing part.

A preferred exemplary embodiment is characterized in that the built-in housing part produced from a steel sheet is joined together from a cover component and a base component, the cover component being preferably formed by a cut-to-size blank comprising a cover plate, the side walls and the rear wall, and at least one guide strip is formed on one side of the clearance provided in the rear wall, in that a guiding surface assigned to the rear wall is also formed on the plug socket and in that, furthermore, a guide strip is formed on a plate which is formed onto the rear wall and serves for connecting the rear wall to the side wall.

An advantage of the present invention may be seen in that the forces acting on the plug socket due to the handling of the built-in device during installation and removal, and also the inserting and pulling of plugs as required, can be absorbed directly by the built-in housing part on account of the play-free connection of the plug socket to the built-in housing part avoiding screwed connections. On the other hand, it is advantageous that the proposed guide of the plug socket offers a defined position of the printed circuit board within the built-in housing part, the mounting of the printed circuit board of the plug socket, preferably guided free from play in one direction, can take place largely tolerance-independent if adequate play is provided for through-holes intended for the fastening of the printed circuit board or a floating mounting of the printed circuit board is provided.

An additional advantage of the present invention lay in an improvement in quality, which may be accomplished without additional component expenditure. Additionally, the guide intended for the plug socket can be formed in the course of producing the cover component by a stamping-bending process. It is particularly effective in this case if the design is formed in such a way that, with appropriate arrangement of the plug socket on the printed circuit board, the guide is assigned to a corner connection between the rear wall and a side wall of the cover component and consequently the side wall concerned is included directly in the distribution of force. Furthermore, it should also be mentioned that the solution found does not necessitate any space requirement for the plug socket outside the built-in housing part.

BRIEF DESCRIPTION OF THE SEVERAL VIEWS OF THE DRAWINGS

The novel features and method steps believed characteristic of the invention are set out in the claims below. The invention itself, however, as well as other features and advantages thereof, are best understood by reference to the detailed description, which follows, when read in conjunction with the accompanying drawing, wherein:

DETAILED DESCRIPTION OF THE INVENTION

Figure 1:
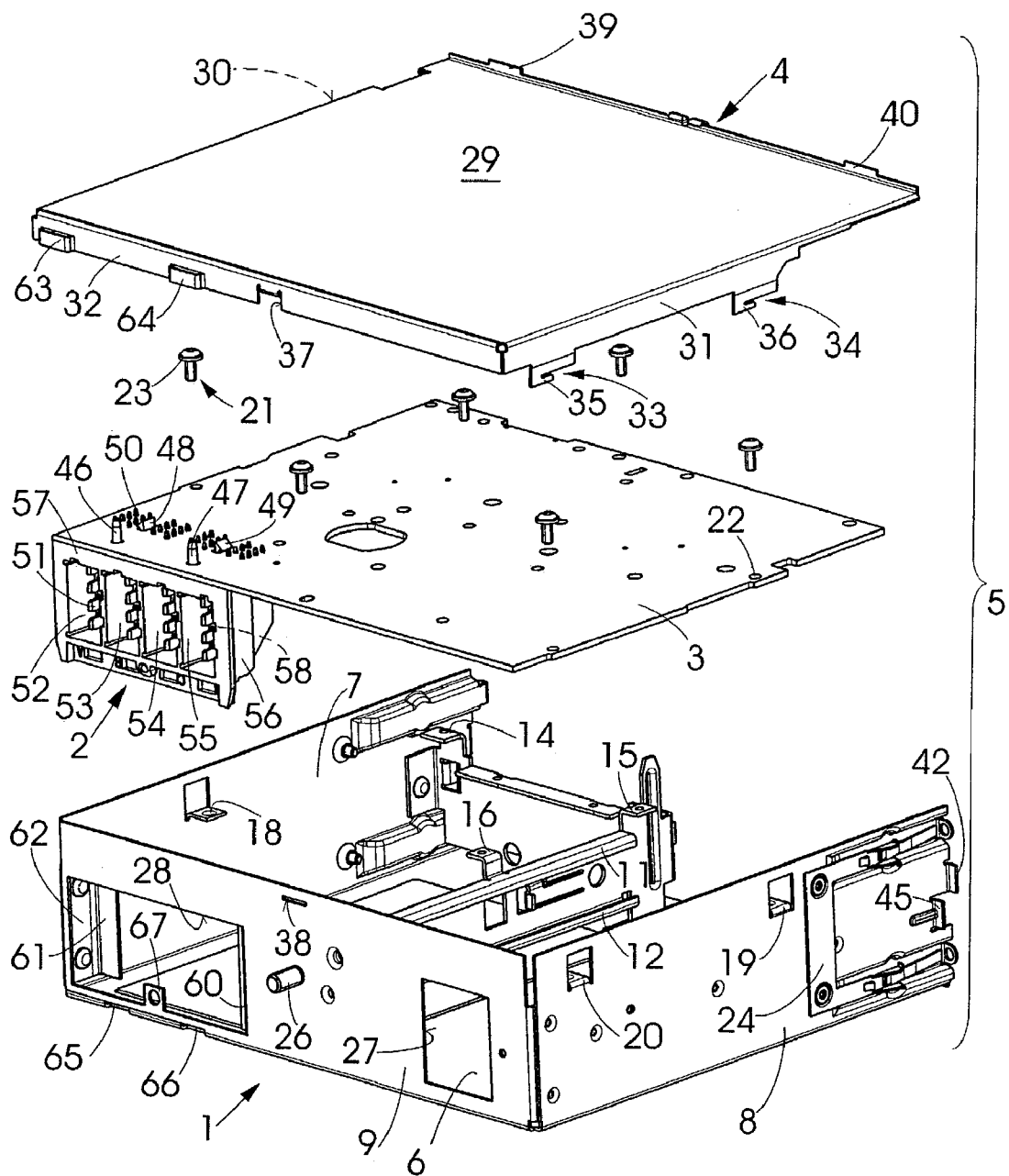
FIG. 1 depicts an exploded representation of the cover component, of the base component, and of the printed circuit board, provided with the plug socket, of the built-in device according to the invention.

FIG. 1 depicts a cover component 1, a printed circuit board 3, provided with a plug socket 2, and a base component 4 of a built-in housing part 5. The aforementioned are represented in accordance with the assembly of the built-in device, during which the pre-assembled cover component 1 is initially placed on its cover plate 6, then the pre-assembled printed circuit board 3 is placed into the cover component 1 and screwed into place, then the base component 4 is connected to the cover component 1 by means of bolt/tongue connections, and finally, a front wall (not depicted) is attached to the built-in housing part 5. It is preferable that the front wall interlocks with the built-in housing part.

Figure 2:
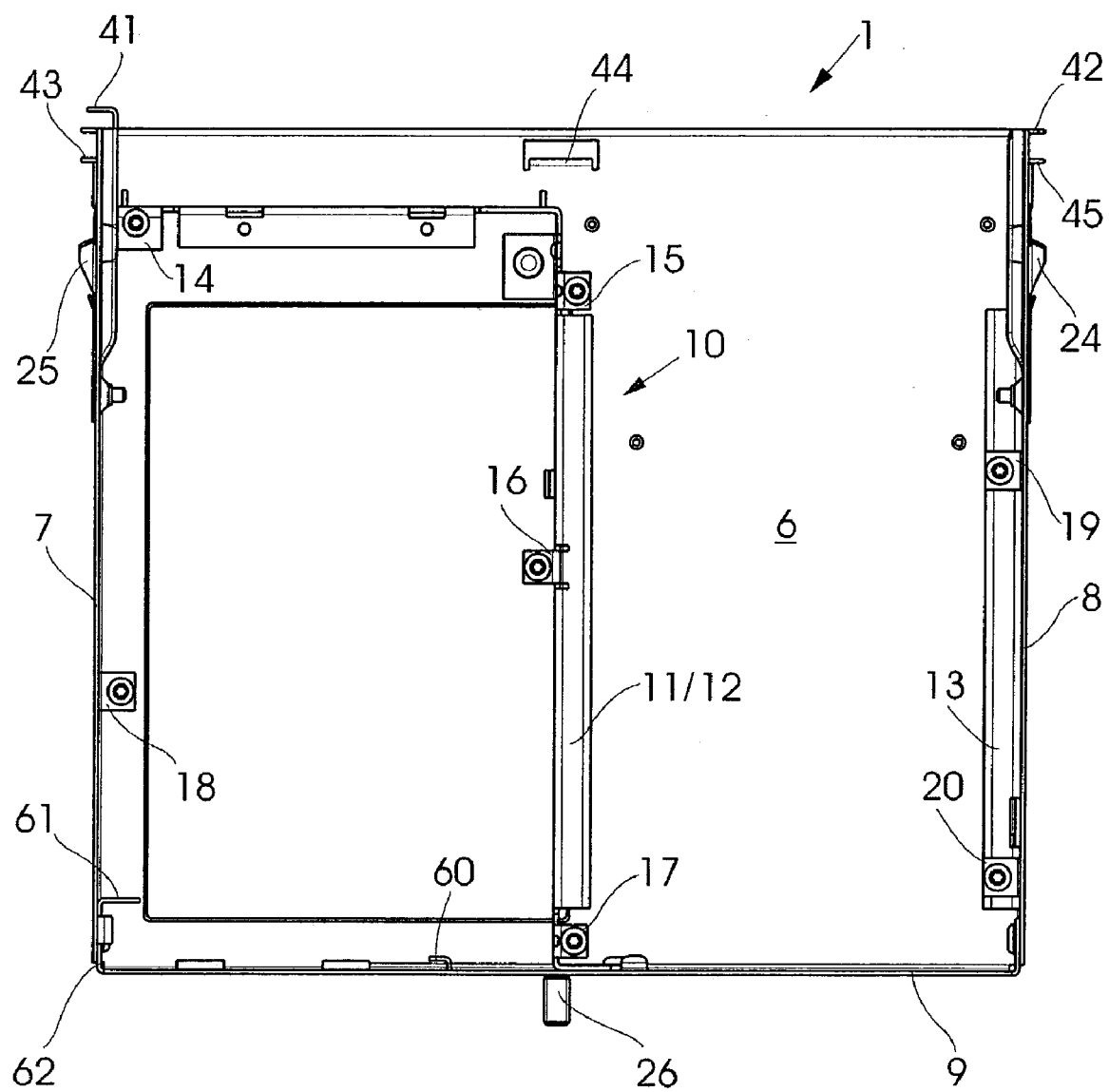
FIG. 2 depicts a plan view of the inner side of the cover component.
Figure 3:
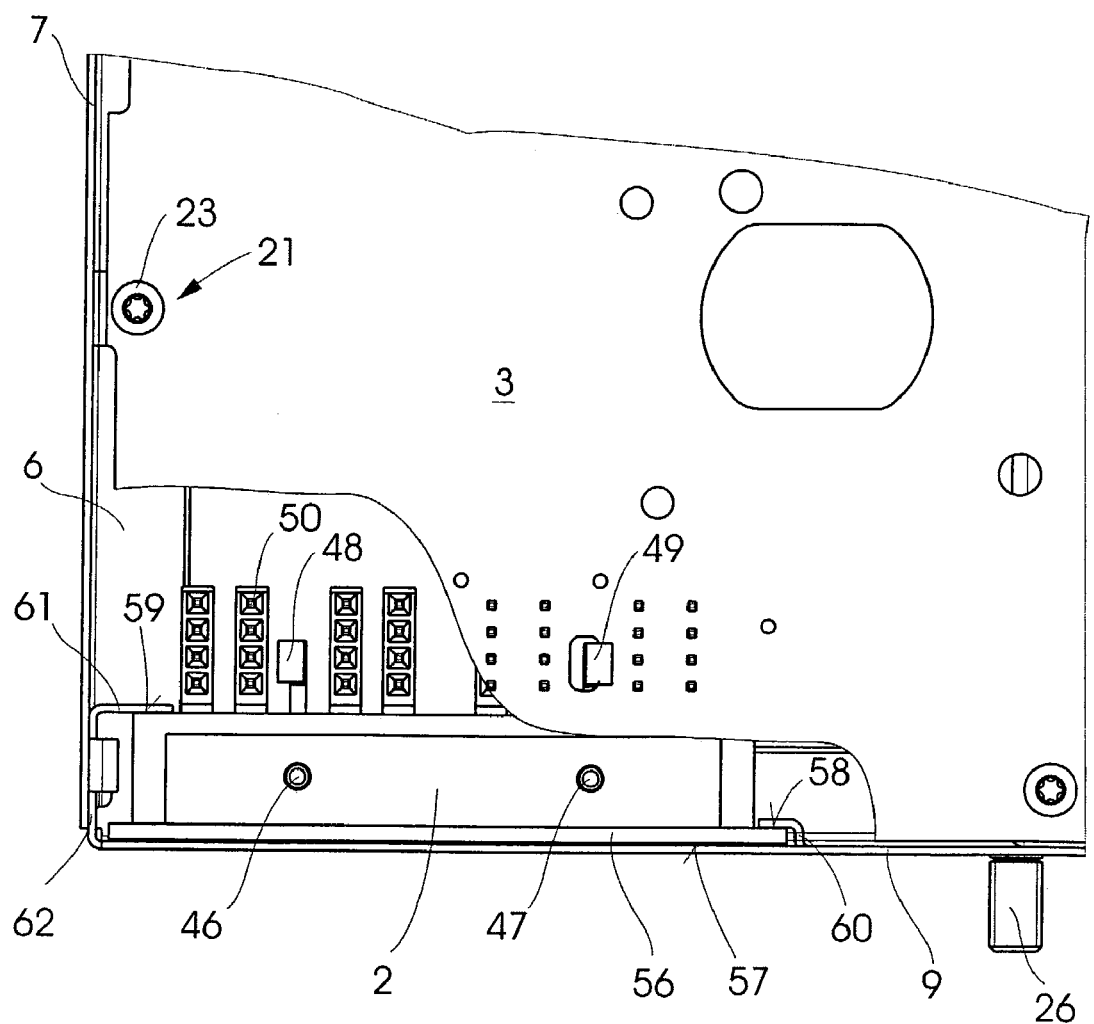
FIG. 3 depicts an enlarged partial representation of the built-in device with the base component removed, and a free section of the printed circuit board.

With further reference to FIG. 1 and the plan view of FIG. 2, the cover component 1 is formed by using a stamping-bending technique to form a cut-to-size sheet-metal blank, which comprises the cover plate 6, side walls 7 and 8 and also a rear wall 9, and the side walls 7, 8 and the rear wall 9 are connected to one another in a suitable way, for example by means of riveted connections. Furthermore, fitted in the cover component 1 is an L-shaped structural part 10, which on the one hand serves as a support for a display assigned to the built-in device and on the other hand, by means of formed-on rails 11 and 12, forms one side of the guide of a carriage of a printing mechanism provided in the built-in device. The other side of the guide of the carriage is formed by a rail component 13 attached to the side wall 8. Brackets 14, 15, 16 and 17, formed on the structural part 10, which acts as a reinforcing housing element, serve jointly with lugs 18, 19 and 20, formed from the side walls 7, 8, for bearing and fastening the printed circuit board 3. The brackets 14–17 and lugs 18–20 comprise drilled holes intended to receive appropriate sized screws, preferably self-tapping screws 21. As the printed circuit board 3 is positioned by means of a guide assigned to the plug socket 2, through-holes provided in the printed circuit board 3 and assigned to the screws 21—one is denoted by 22—are dimensioned in such a way that the production tolerances of the printed circuit board 3 and cover component 1 remain without any effect in the plane of the printed circuit board. Accordingly, it is expedient to assign shims to the screws 21 used or, to simplify assembly, to use screws on which a widened head 23 is formed.

Pairs of resilient claws 24 and 25, formed as U-shaped components and fastened to the side walls 7, 8, fasten the built-in device in an installation compartment or, if the built-in device is a tachograph, in a suitable opening in a dashboard. A bolt 26, fastened to the rear wall 9 of the cover component 1 and possibly provided with a thread, provides for alignment and vibrational securement of the built-in housing in the installed state. Opening 27 provided in the rear wall 9 provides a fitting for a battery compartment; a clearance 28 is provided for access to the plug socket 2.

As further set out in FIG. 1, legs 30, 31 and 32 are formed on the sides and rear of a base plate 29 of the base component 4. Two tongues 35 and 36 are depicted in FIG. 1 and are formed on legs 30 and 31 as well as provided with suitable slits 33, 34. The tongues interact with lugs 18–20 and brackets 14 for connecting the base component 4 in a play-free manner to the cover component 1. The legs 30 and 31 engage cover component 1 and leg 32 bears against the outside of rear wall 9 after a bayonet-like assembly movement between the base component 4 and the cover component 1. An additional connection is formed by a bolt 37, which is formed on the base component 4 and engages in a slit 38 provided in the rear wall 9. Snap connecting means (i.e. tongues) 39–41, which fasten a front wall (not depicted), are depicted in FIGS. 1 and 2 as interacting with suitable depressions in the front wall. Lugs which serve as stops during the installation of the built-in device are denoted by 43, 44 and 45.

The connection of plug socket 2 to printed circuit board 3 takes place by means of aligning pins 46 and 47, formed on plug socket 2, with locking hooks 48 and 49, as well as by soldering of contact pins 50 of the plug-in contacts 51, embedded by an injection-molding technique in the plug socket 2, to conductor tracks (not represented) provided on the printed circuit board 3. Per the present embodiment, plug socket 2 has four plug chambers 52, 53, 54 and 55, with eight plug-in contacts 51 in each case. With a collar 56, running part of the way around the plug socket 2, guiding surfaces 57 and 58 are formed. A further guiding surface 59 is formed on the body of the plug socket 2. Rear wall 9 serves as a guiding element for surfaces 57, 58 of plug socket 2, along with guide strip 60, formed on the rear wall. A further guide strip 61, completing the guidance of the plug socket 2, is bent on a plate 62, formed onto the rear wall 9 and connects the rear wall 9 and the side wall 7. The assignment of the guidance of the plug socket 2 to a corner connection of the cover component 1 produces an especially stable reception of the plug socket 2 and a direct force transmission to the side wall 7.

The guide provides and otherwise ensures a play-free seating of the plug socket 2 in the direction of the plug-in contacts 51. By this connection, it is also conceivable to mount the printed circuit board 3 in a floating manner in the cover component 1, or to fasten it in such a way that relative movements between the printed circuit board 3 and the cover component 1 are possible and, as a result, it is possible to compensate for stresses caused both mechanically and thermally. For this purpose, ball pins provided with slits may be formed on the support of the printed circuit board 3 in the cover component 1, or suitable spring elements which hold the printed circuit board 3 securely on the support may be provided. Finally, it is noted that the guide strip 60 may be formed by at least two tongues that are separate from one another. It is also possible to form the guide strip 60, or the tongues from the rear wall, independently of the clearance 28. Eyelets formed in the leg 32 of the base component 4 are denoted by 63 and 64; slits which are provided in the cover component 1 and serve for attaching a cover shroud, which is not absolutely necessary, are denoted by 65 and 66. To be able to secure the cover shroud by means of a screw and a lead seal assigned to the latter, a lug 67 with a drilled hole is formed on the rear wall 9.

The invention being thus described, it will be obvious that the same may be varied in many ways. The variations are not to be regarded as a departure from the spirit and scope of the invention, and all such modifications as would be obvious to one skilled in the art are intended to be included within the scope of the following claims.

I claim:

1. An electronic device, comprising:
   a front wall;
   a built-in housing part comprising a cover, a base, side walls, and a rear wall;
   a printed circuit board arranged transversely in relation to said rear wall and connected to at least two housing element of the built-in housing part, said board carrying electronic subassemblies and components of a built-in device as well as a plug socket wherein access to contacts of said plug socket is facilitated through an opening in said rear wall, said board further comprising at least one through-hole for fastening, in combination with an appropriate size screw, said board in said housing, said at least one through-hole having a larger diameter than a shank diameter of said screw, said larger diameter being a product of a sum of production tolerances of at least said board and housing;
   guiding surfaces formed on said plug socket, said guiding surfaces being substantially parallel to said rear wall;
   wherein said housing is comprised of a steel sheet joined together so as to form a cover component and a base component, said cover component preferably being formed by a cut-to-size blank comprising a cover plate, said side walls and said rear wall and in that at least one guide strip is formed directly on said rear wall; and
   a guide strip is formed on a plate which is formed onto the rear wall and serves for connecting said rear wall to said side wall.

2. The device according to claim 1, wherein said plug socket is aligned substantially parallel to said printed circuit board.

3. The device according to claim 1, wherein said guiding surfaces are formed on said plug socket at substantially right angles to the direction of said plug-in contacts.

4. The device according to claim 1, wherein said guide is formed by cooperation of said rear wall and guide strips attached to a built-in housing part.

5. The device according to claim 1, wherein said guide strips are formed on opposite sides of said opening and at right angles to a fastening plane of said printed circuit board.

6. The device according to claim 1, wherein a guiding surface assigned to said rear wall is formed on the plug socket.

7. The device according to claim 1, wherein said guide strips are formed by opposing tongues protruding into said opening, alternately provided essentially planar to the rear wall and parallel to the rear wall, and in that guide rails corresponding to a distance between said tongues, provided transversely to the guiding direction, are formed on said plug socket.

8. An electronic device comprising:
   a front wall,
   a built-in housing part comprising a cover, a base, side walls and a rear wall
   a printed circuit board, arranged transversely in relation to said rear wall connected to at least two housing elements of said built-in housing part and carrying electronic subassemblies and components of said built-in device and a plug socket, access to contacts of said plug socket aligned parallel to said printed circuit board and available through an opening provided in the rear wall of said built-in housing part,
   guiding surfaces formed on said plug socket at right angles to a direction of said contacts, wherein said guiding surfaces are associated, within the built-in housing part, with a guide parallel to said rear wall, without any play, and in that holding-down means, allowing relative movements between said printed circuit board and said side walls, are provided for fastening of said printed circuit board on a support formed by lugs provided on said side walls of said built-in housing part;
   wherein said housing is comprised of a steel sheet joined together so as to form a cover component and a base component, said cover component preferably being formed by a cut-to-size blank comprising a cover plate, said side walls and said rear wall and in that at least one guide strip is formed directly on said rear wall; and
   a guide strip is formed on a plate which is formed onto the rear wall and serves for connecting said rear wall to said side wall.

* * * * *